United States Patent [19]

Anderson

[11] Patent Number: 4,698,235

[45] Date of Patent: Oct. 6, 1987

[54] SITING A FILM ONTO A SUBSTRATE INCLUDING ELECTRON-BEAM EVAPORATION

[75] Inventor: Joseph C. Anderson, London, England

[73] Assignee: National Research Development Corporation, London, England

[21] Appl. No.: 534,866

[22] Filed: Sep. 22, 1983

Related U.S. Application Data

[63] Continuation-in-part of Ser. No. 531,724, Sep. 13, 1983, abandoned.

[30] Foreign Application Priority Data

Sep. 29, 1982 [GB] United Kingdom ............... 8227776

[51] Int. Cl.$^4$ ............................................. B05D 3/06
[52] U.S. Cl. .................................. 427/42; 427/248.1; 427/250; 427/255.2
[58] Field of Search ............ 427/42, 255.2, 250, 427/248.1

[56] References Cited

U.S. PATENT DOCUMENTS

| | | | |
|---|---|---|---|
| 2,784,115 | 3/1957 | Brinsmaid et al. | 427/166 |
| 2,930,002 | 1/1960 | Auwarter | 331/117 R |
| 2,932,588 | 4/1960 | Frank | 427/42 |
| 3,063,871 | 11/1982 | Barkemeyer et al. | 427/42 |
| 3,617,375 | 11/1971 | Marck | 427/42 |
| 3,791,852 | 2/1974 | Bunshah | 427/38 |
| 3,953,652 | 4/1976 | Addiss et al. | 427/42 |
| 3,984,581 | 10/1976 | Dobler et al. | 427/42 |
| 4,006,268 | 2/1977 | Kennedy et al. | 427/42 |
| 4,112,137 | 9/1978 | Zega | 427/42 |
| 4,217,374 | 8/1980 | Ovshinsky et al. | 427/42 |
| 4,238,525 | 12/1980 | Aichert et al. | 427/42 |
| 4,297,387 | 10/1981 | Beale | 427/42 |

FOREIGN PATENT DOCUMENTS

| | | |
|---|---|---|
| 0029747 | 6/1981 | European Pat. Off. . |
| 0031918 | 7/1981 | European Pat. Off. . |
| 0058543 | 8/1982 | European Pat. Off. . |
| 56-78112 | 6/1981 | Japan . |
| 56-98819 | 8/1981 | Japan . |
| 56-69819 | 8/1981 | Japan . |

OTHER PUBLICATIONS

*High Rate Evaporation/Deposition Processes of Metals, Alloys and Ceramics for Vacuum Metallurgical Applications*, R. F. Bunshah, pp. 814–819.

Primary Examiner—Norman Morgenstern
Assistant Examiner—Janyce A. Bell
Attorney, Agent, or Firm—Cushman, Darby & Cushman

[57] ABSTRACT

A single-crystal ingot I of boron-doped silicon is electron-beam heated in ionized hydrogen. Using an electrode E to apply an electric field from the ingot I towards a heated substrate S, which is r.f. biassed, an amorphous boron-doped silicon film deposits on the substrate S.

Intrinsic and n-type material can also be produced.

6 Claims, 1 Drawing Figure

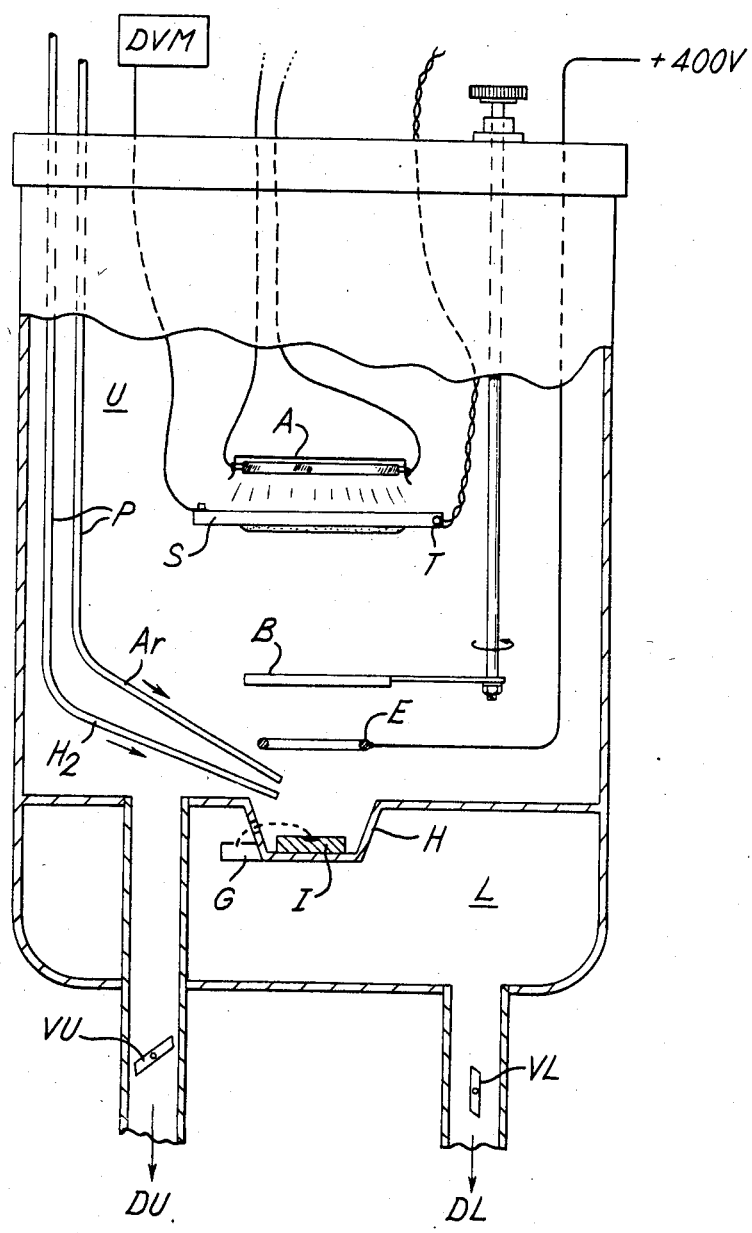

SITING A FILM ONTO A SUBSTRATE INCLUDING ELECTRON-BEAM EVAPORATION

CROSS-REFERENCE TO RELATED APPLICATION

This application is a continuation-in-part of my earlier application, Ser. No. 531,724, filed Sept. 13, 1983, now abandoned.

This invention relates to the deposition of a film onto a substrate, including evaporating under reduced pressure the material which is to constitute the film by an electron beam directed onto the material.

U.S. Pat. No. 2,920,002 describes a process for the manufacture of thin films of such materials as titanium dioxide and silicon dioxide (silica) by vapourising titanium/silicon in an evacuated chamber into which about $10^{-2}$ mm Hg of pre-ionised oxygen is introduced. The titanium/silicon is heated electrically in a tungsten boat.

U.S. Pat. No. 3,791,852 describes an improved process wherein titanium, hafnium, niobium or vanadium is vapourised in a vacuum chamber by an electron beam. Acetylene ($C_2H_2$) is introduced into the chamber and the metal vapour and the gas molecules are activated by secondary electrons emitted from the molten pool of metal which are collected by a secondary electrode having a low positive voltage with respect to the metal pool. This causes a reaction zone to form between the electrode and the pool.

The activation of the reactants increases the probability of a reaction between them, and the metal vapour/hydrocarbon gas reaction is achieved with a high efficiency producing the desired metal carbide film on the substrate. With this process, deposition rates substantially higher than those previously obtained are achieved and substrate temperature is not a limiting factor as in chemical vapour deposition. The acts of compound synthesis and film growth are separated. The microstructure of the deposit, and hence its physical and mechanical properties, are dependent on the substrate temperature, which can be varied at will.

According to the present invention, there is provided a process for depositing a film onto a substrate, comprising evaporating under reduced pressure one or more elements which are to be constituents of the film by an electron beam directed onto the element(s), and heating the substrate, characterised in that the process is performed in an atmosphere containing hydrogen which is ionised by collecting, by applying an electric field, electrons emitted thermally from the element(s), and in that the element(s) is (are all) chosen such as to form compound(s) with hydrogen in the ionised gas, such that on reaching the heated substrate a film of somewhat hydrogenated element(s) is formed, the crystallographic structure of the film being substantially free of electrically active defects compared with a nonhydrogenated evaporated film (hydrogen taking up any 'defect' bonds). Hitherto, hydrogen had never been used as the reactive gas, and, used as the element by itself, it avoids any risk of extraneous gases being incorporated into the deposited film. Direct evaporation/deposition, and likewise sputtering, would lead to a crystallographically unacceptably defective structure.

Further according to the present ivention, there is provided a process for depositing a film onto a substrate, comprising evaporating under reduced pressure a supply of the film-constituting material by an electron beam directed onto the supply, providing an atmosphere of an ionised gas which reacts with the evaporated material, and heating the substrate, characterised in that the material comprises a plurality ofelements, all reactive with the gas, whereby the resulting compounds on contacting the heated substrate decompose to leave a film comprising all the elements. The evaporation of mixed materials is disclosed in J. Vac. Sci. Technol. Vol. 11, 1974, pp. 814–819 at 815 and 817. Multiple sources could be used, such as nickel and thorium, in oxygen, producing a dispersion-strengthened nickel-thoria material. Single sources (of alloy) have also been used, from which alloy deposits such as Ag-5Cu, Ag-10Cu and Ti-6Al-4V have been prepared, the source being of a composition adjusted to compensate for vapour pressure differences between the components. However, in these processes, either no component, or at most one component, reacts with the gas provided, and then moreover is deposited as a reacted compound. This invention enables the deposition of such materials as doped semiconductors, e.g. Si-B or Si-P, the starting supply of which is evaporated and all components of which are capable of reacting with hydrogen (though not all atoms do) so that the material is deposited ready-doped and contains a certain proportion of hydrogen.

Further according to the present invention, there is provided a process for depositing an optionally doped film of preferably elemental semiconductor onto a substrate, comprising evaporating a supply of the semiconductor under reduced pressure in an ionised gas by an electron beam directed onto the supply, and heating the substrate, such that, on contacting the substrate, the evaporated element deposits as a film, characterised in that the supply is a single crystal. Further according to the present invention, there is provided a process for depositing a doped film of preferably elemental semiconductor onto a substrate, comprising evaporating a (preferably single crystal) supply of the semiconductor under reduced pressure in an ionised gas characterised in that the ionised gas contains hydrogen and a gas capable of acting as a dopant, for example nitrogen. The semiconductor is preferably germanium or silicon, and hitherto silicon has been deposited by this type of method as always an oxide, preferably the fully saturated oxide $SiO_{2.00}$.

The substrate is electrically biassed, by means of radio frequency voltage, to a net negative potential with respect to earth.

Where not mandatory, it is preferred for the element (or one of the elements) to be a semiconductor such as silicon or germanium, the second element (if any) preferably being a dopant such as boron or phosphorus. There is preferably a single supply of the element(s), preferably in the form of a single crystal. The atmosphere may contain hydrogen and, optionally additionally, a gas capable of acting as a dopant for the semiconductor, for example nitrogen.

Given a specific material which it is desired to deposit, such as hydrogenated amorphous silicon of a certain grade, it is preferable to adjust certain parameters in the process for the best results, as follows:

(i) Gas composition in the process: this is preferably hydrogen, optionally plus a rare gas (such as helium, krypton or, preferably, argon).

(ii) Gas pressure: this should not be so low that the silicon evaporates and deposits without reacting with any gas on the way, nor so high that its transport is excessively prolonged, and is preferably from $1\times10^{-3}$ to $5\times10^{-3}$ mB.

(iii) Gas flow rate, for example a total rate of 25 to 50 ml/min.

(iv) Evaporation rate of the feedstock: this is determined by the power of the electron beam directed onto it and, in turn, determines the product deposition rate. It is preferably high enough to make the process reasonably economical but not so high that a structurally unsatisfactory product is obtained, for example 1.5 to 2.5 kW.

(v) The ionisation current (for example 0.3 A to 3 A) and the voltage (for example 100 V to 500 V) applied to promote the gas-phase reaction.

(vi) Substrate temperature, for example 25 C. to 350 C.

(vii) Substrate potential with respect to the ionised gas.

The invention will now be described by way of example with reference to the accompanying drawing, which shows schematically apparatus for performing the process. The process will be described in relation to deposition of a film of amorphous boron-doped Si:H.

An evacuable vessel is divided by a deck into an upper chamber U, evacuated by a diffusion pump DU throttled by a value VU, and a lower chamber L, evacuated by an independent diffusion pump DL throttled by a valve VL. The deck includes a water-cooled copper hearth H, in which an ingot I is placed consisting of a 25 mm×50 mm single crystal of p-type silicon containing $1.6\times10^{23}$ atoms of boron per cubic meter and having a resistivity of 0.1 ohm cm, as a material to constitute the film to be deposited.

An electron gun G provides a focused primary electron beam through a slot between the chambers to melt the ingot I. Stainless steel pipes P controlled by needle valves carry gases (Ar and $H_2$) into the upper chamber U to the vicinity of the surface of the molten ingot. A circular electrode E of stainless steel wire is positioned just above the hearth H and has a diameter approximately equal to that of the mouth of the hearth. A positive voltage can be applied to this electrode to ionise the gas. A shutter B screens a substrate S on which the film is to be deposited from the material (ingot I) in the hearth H until deposition is required. A holder for the substrate S is insulated from earth and carries a thermocouple T to measure its temperature except when bias is applied to the substrate, when the thermocouple must be removed to avoid shorting the bias to earth. The holder may however be earthed through a digital voltmeter DVM, which acts as an auto-bias resistor biassing the substrate such that the ion current flowing to it from the ionised gas (to be described) is negligibly small. Alternatively, a power supply e.g. of radio frequency can be substituted for the voltmeter DVM to regulate the substrate voltage and hence the ion bombardment of the substrate, as will be described. Adjustable infrared radiation heaters A provide for heating of the substrate.

A glass slide, typically Corning 7059 glass, is ultrasonically cleaned in an amphiphilic detergent, distilled water and isopropyl alcohol as conventional and then mounted in the substrate holder to act as the substrate S. The shutter B is placed to block the substrate's view of the ingot I (source) and the heaters A are turned on to give a substrate temperature of 250° C. The system is pumped down to a pressure of about $10^{-6}$ mB in both chambers U and L and the primary electron beam (from the gun G) is slowly turned up to a power of 2 kW. When a molten pool on the ingot surface is establishd the needle valves in the pipes P are opened to provide a flow of 30 milliliters per minute (mlm) of hydrogen.

The valve VU controlling the evacuation of the upper chamber U is now slightly closed, to give a total pressure in this chamber of $2\times10^{-3}$ mB. The pressure in the lower chamber L, which is more vigorously pumped, does not exceed $5\times10^{-4}$ mB; this is necessary to prevent extinction of the electron beam from the gun G, which depends for operation on an atmosphere sufficiently rarefied not to strike an arc at a field of 16 kV/mm. A voltage of +400 volts is then applied to the electrode E and an ionisation current of about 0.1 A flows.

Then, as one option, with the digital voltmeter DVM present, the substrate S develops a self-bias of about +350 V with an ion current of about 0.1 A flowing to it. The shutter B is opened for 3 minutes causing a hydrogenated, boron-doped, p-type amorphous silicon film of thickness about 1.0 μm to be deposited on the glass substrate; the film was annealed under $1\times10^{-5}$ torr vacuum for 3 hours at 200° C. Typically the film has a p-type resistivity of $10^6$ ohm cm, with a boron (acceptor) concentration of around $10^{23}$ boron atoms per cubic meter and with a density of around $10^{22}$ traps/cubic meter.

As an alternative option, a radio frequency power supply is installed at the site DVM. In this option, the source (the ingot I) is intrinsic silicon (i.e. undoped silicon). After the voltage of +400 volts has been applied to the electrode E and the ionisation current has started to flow, an r.f. bias of −1500 V is applied to the substrate S; the flow of current to the electrode E thus rises to 0.5 A. The shutter B is opened for 5 minutes causing a hydrogenated, p-type amorphous silicon film of thickness about 0.5 μm to be deposited on the glass substrate. The net rate of deposition in this option, as can be seen, is somewhat lower. The film was annealed under $1\times10^{-5}$ torr vacuum for 3 hours at 200° C. Typically the film had a resistivity of $10^{10}$ ohm cm at room temperature and a photoconductivity ratio of $10^5$ when illuminated with AM1 sunlight.

By corresponding processes, intrinsic and n-type material can be produced.

What is claimed is:

1. A process for depositing a film onto a substrate, comprising evaporating under reduced pressure at least one element which is to be a constituent of the film by an electron beam directed onto the element, and heating the substrate, the process being performed in an atmosphere containing hydrogen, the hydrogen being ionised by electrons emitted thermally from the element, the electrons being collected by applying an electric field and wherein each element is chosen such as to form a compound with hydrogen in the ionised gas, such that on reaching the heated substrate a film of a partially hydrogenated element is formed, the crystallographic structure of the film being substantially free of electrically active defects compared with a nonhydrogenated evaporated film, in which process the substrate is electrically biased by a radio frequency voltage to a net negative potential with respect to earth.

2. A process according to claim 1, wherein the element is one of silicon and germanium.

3. A process according to claim 2, wherein more than one element is present, and the second element is one of boron and phosphorus.

4. A process according to claim 1, wherein there is a single supply of the element.

5. A process according to claim 4, wherein the supply is in the form of a single crystal.

6. A process according to claim 1, wherein the atmosphere contains, additionally, a gas capable of acting as a dopant for a semiconductor.

* * * * *